United States Patent
Yoshii et al.

[11] Patent Number: 5,969,820
[45] Date of Patent: Oct. 19, 1999

[54] SURFACE POSITION DETECTING SYSTEM AND EXPOSURE APPARATUS USING THE SAME

[75] Inventors: Minoru Yoshii, Tokyo; Masanobu Hasegawa; Kyoichi Miyazaki, both of Utsunomiya, all of Japan

[73] Assignee: Canon Kabushiki Kaisha, Tokyo, Japan

[21] Appl. No.: 08/873,748

[22] Filed: Jun. 12, 1997

[30] Foreign Application Priority Data

Jun. 13, 1996 [JP] Japan .................................. 8-174335
Jun. 13, 1996 [JP] Japan .................................. 8-174337

[51] Int. Cl.$^6$ .................................................. G01B 11/00
[52] U.S. Cl. ...................................... 356/375; 250/201.6
[58] Field of Search ................................... 356/375, 400, 356/401; 355/53; 250/548, 201.4, 201.6

[56] References Cited

U.S. PATENT DOCUMENTS

| | | | |
|---|---|---|---|
| Re. 35,350 | 10/1996 | Shahar et al. | 356/375 |
| 4,373,804 | 2/1983 | Pryor et al. | 356/376 |
| 5,396,335 | 3/1995 | Hasegawa et al. | 356/401 |
| 5,473,166 | 12/1995 | Imai et al. | 356/401 |
| 5,486,919 | 1/1996 | Tsuji et al. | 356/349 |
| 5,495,336 | 2/1996 | Nose et al. | 356/375 |
| 5,585,918 | 12/1996 | Takeuchi et al. | 356/237 |
| 5,652,657 | 7/1997 | Yoshii et al. | 356/394 |

FOREIGN PATENT DOCUMENTS 6-283403  10/1994  Japan .

Primary Examiner—F. L. Evans
Attorney, Agent, or Firm—Fitzpatrick, Cella, Harper & Scinto

[57] ABSTRACT

A surface position detecting system for detecting a position of a surface of an object disposed opposed to an exposure system, with respect to a direction of an optical system of the exposure system, includes an irradiation device for projecting light to the surface of the object, obliquely with respect to the optical axis of the exposure system, a detecting device for detecting light from the surface of the object irradiated with light from the irradiation device, the detecting device detecting a position of the surface of the object with respect to the optical axis direction of the exposure system, and a light quantity adjusting device provided in at least least one of the irradiation device and the detecting device, for controlling the quantity of light passage.

3 Claims, 15 Drawing Sheets

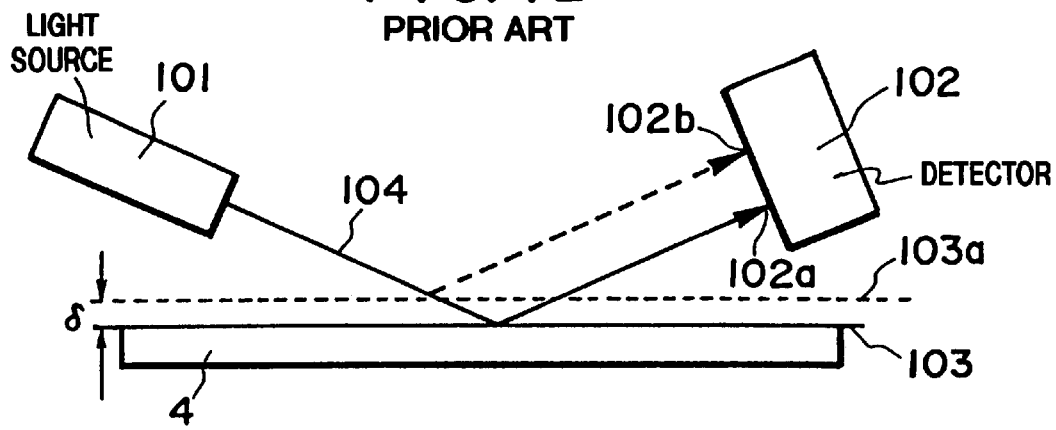
FIG. IB
PRIOR ART
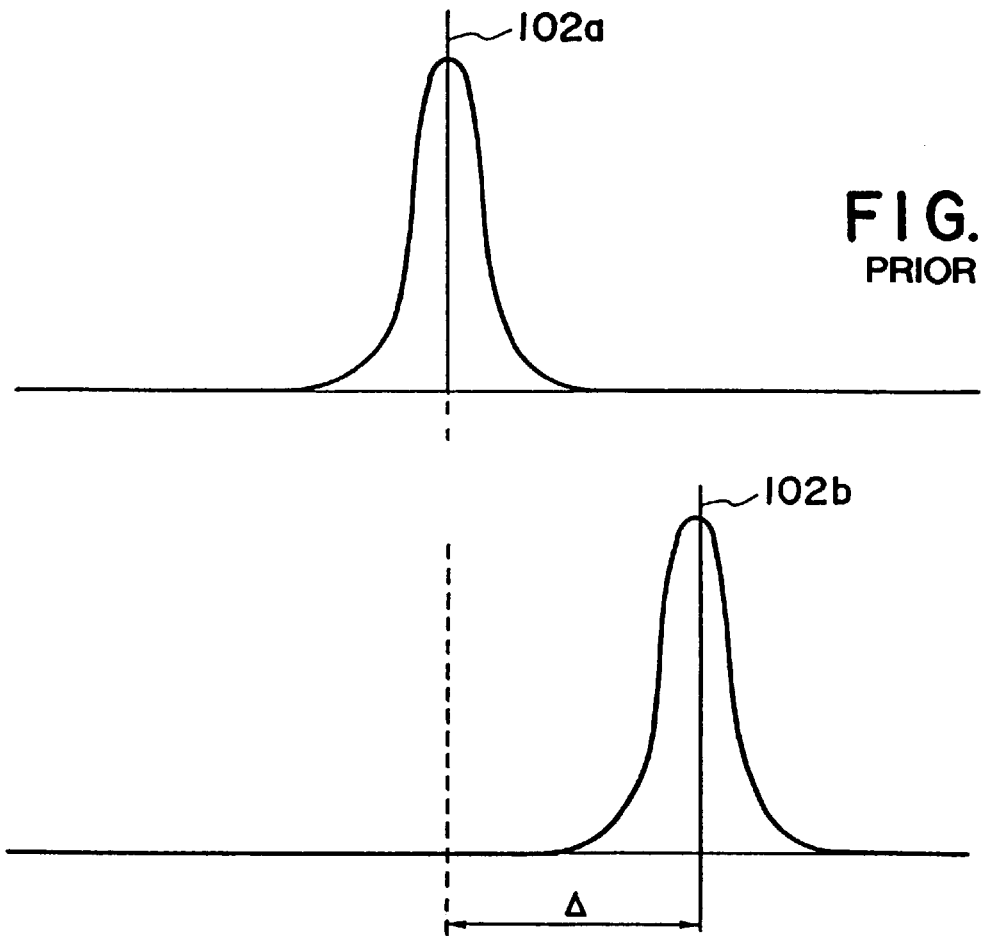
FIG. IC
PRIOR ART
FIG. ID
PRIOR ART

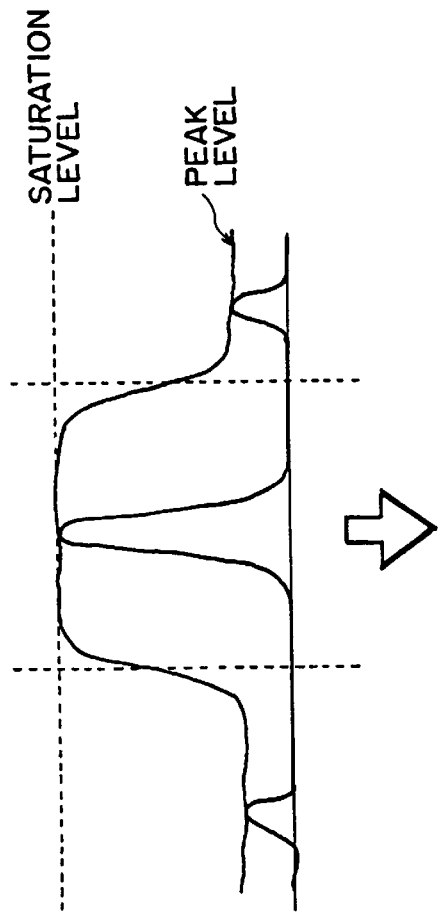
FIG. 7(A)
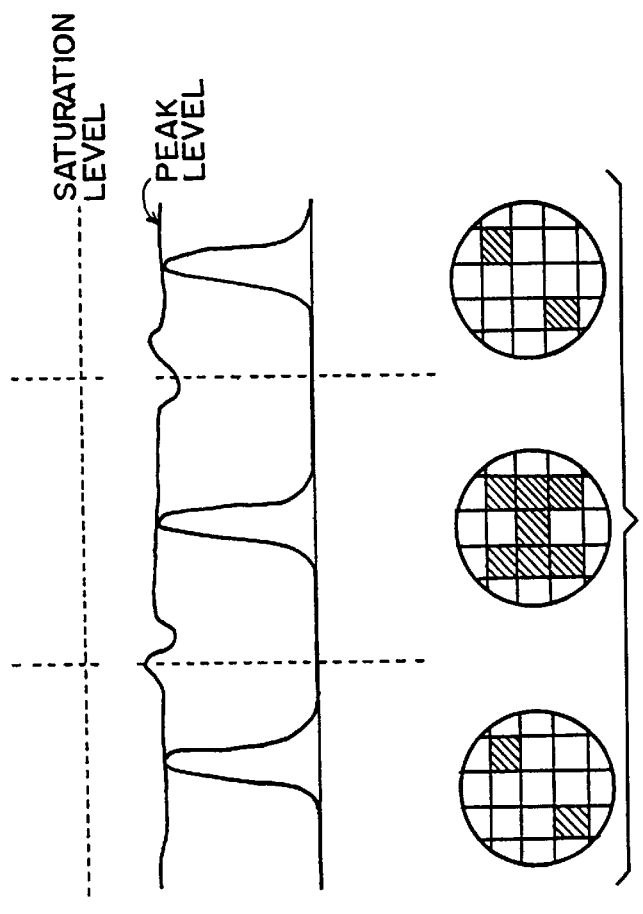
FIG. 7(B)
FIG. 7(C)

SURFACE POSITION DETECTING SYSTEM AND EXPOSURE APPARATUS USING THE SAME

FIELD OF THE INVENTION AND RELATED ART

This invention relates to a surface position detecting system and, in another aspect, to an exposure apparatus or a device manufacturing method using the same. More particularly, the invention is suitably applicable to a projection exposure apparatus or a scanning exposure apparatus to be used in a lithographic process, which is one of the processes for the manufacture of semiconductor devices, such as ICs or LSIs, image pickup devices such as CCDs, display devices such as liquid crystal panels, or other devices such as magnetic heads, for example. When in such apparatus a pattern of a first object such as a reticle is to be projected onto a surface of a second object such as a wafer by means of a projection optical system, a surface position detecting system of the present invention is effectively applicable to position adjustment (focusing) of the wafer with respect to an optical axis direction.

In the field of microprocessing in the manufacture of semiconductor devices such as ICs or LSIs, many proposals have been made to a reduction projection exposure apparatus (stepper) wherein an image of a circuit pattern of a mask (reticle) is formed on the surface of a photosensitive substrate through a projection optical system (projection lens) so that the photosensitive substrate is exposed to the pattern in a step-and-repeat method. In such steppers, a circuit pattern of a reticle is projected onto a predetermined position on the surface of a wafer in a reduced scale, by means of a projection optical system having a predetermined reduction magnification, whereby the pattern is transferred to there. After completion of one projection transfer operation, a stage on which the wafer is placed is moved by a predetermined amount, and the pattern transfer operation is repeated. This process is repeated until exposure of the whole wafer surface is accomplished.

Generally, when a fine circuit pattern is to be transferred by use of a stepper having a projection optical system, it is important to set the focus position (the position with respect to a direction of an optical axis of a projection optical system) correctly with respect to the surface of a wafer. Particularly, with increases in the degree of integration, it has recently been required that the wafer surface is set with respect to a projection optical system on an order of sub-microns.

FIG. 1A is a schematic view of a main portion of a projection exposure apparatus having a surface position detecting system of a known type, for detecting positional information (optical axis direction related information) of a surface of a wafer.

In FIG. 1A, denoted at 2 is a reticle (circuit original), and denoted at 3 is a projection lens for projecting the original 2 in a reduced scale of 1:5. Denoted at 4 is a wafer which is coated with a resist, and denoted at 7 is a stage for moving the wafer. When a light source 1 is turned on and the reticle 2 is illuminated with light from the light source 1, a circuit pattern formed on the reticle 2 is imaged on the wafer 4, whereby the circuit pattern is printed on the resist of the wafer. After the printing onto one shot area is completed, the stage 7 is moved stepwise, and the pattern is printed onto an adjacent shot area. In this manner, images of the circuit pattern are printed on the whole surface of one wafer in matrix fashion. In mass-production processes of ICs, with continuing operation of an exposure apparatus, printing of about sixty wafers is performed per hour.

Light source 101 and light position detector 102 constitute a surface position detecting system for detecting the height position (position with respect to the optical axis direction) of the wafer 4. More specifically, the surface position detecting system operates so that the wafer 4 is positioned at the imaging position, for the circuit pattern of the reticle 2, of the projection lens 3.

FIGS. 1B through 1D are a schematic view for explaining the principle of detection for the height position of the wafer 4.

In these drawings, light 104 emitted by the light source 101 is reflected by the wafer surface 103 (at wafer height 1), and the light position detector 102 detects the position of light (e.g., peak position 102*a*).

When the wafer 4 moves to a surface 103*a* position (wafer height 2), reflected light moves to position 102*b*. There is a proportional relation between a change $\delta$ in wafer 4 height and displacement $\Delta$ of the light position, and the change $\delta$ in height can be detected by measuring the displacement $\Delta$.

FIG. 2 is an enlarged view of a portion of FIG. 1B, around the wafer 4 surface.

In this drawing, denoted at 4*a* is a wafer substrate having been processed by sputtering or etching, for example, made to a silicon substrate. A photosensitive material (resist) denoted at 4*b* is applied onto it. When light 104 from the light source 101 is projected onto the surface of a wafer of such a structure described above, the light is reflected by both the surface of the wafer substrate 4*a* and the surface of the resist 4*b*, such that interference occurs between reflected lights from the wafer. As a result, due to non-uniformness of thickness of the resist 4*b* or to the process structure of the bottom substrate, the position of light upon the light position detector 102 changes. This causes an error in the detection of height position of the wafer 4. In consideration of this possibility, some conventional exposure apparatuses use a halogen lamp for the light source 101. A halogen lamp has emission wavelengths of 500 to 1100 nm and, thus, a wide wavelength range of about 600 nm. Therefore, the interference can be averaged, within the wavelength range of 600 nm. Thus, the wafer height detecting system is less affected by non-uniform resist thickness or the process structure of the bottom substrate, and it shows stable performance.

While a halogen lamp has a superior property, there is a necessity that the light quantity of a halogen lamp should be changed in accordance with a change in reflectivity of the wafer bottom substrate. Conventionally, the light quantity of a halogen lamp is changed by changing an electric voltage. The rate of changing the light quantity in this method is on an order of a few hundreds of msec. However, in a step-and-scan type projection exposure apparatus, which is one of reduction projection exposure apparatuses and which enables a wider area exposure, it is particularly important that the light quantity can be adjusted quickly on an order of msec.

More specifically, the step-and-scan method is a method wherein a reticle and a wafer are scanned simultaneously, and it is suitable for the manufacture of LSIs of a larger chip size of about 25×32 mm, for example. In such a step-and-scan method, a wafer is exposed with a slit of about a 5 mm width while the wafer is scanned at a speed of about 150–200 mm per sec. It is, therefore, necessary that, while scanning one chip of a wafer in a scan direction, the wafer height is measured and controlled in real time, within a period of a few tens of msec. Within one chip, there are a portion with high reflectivity (such as aluminum wirings) and a portion with low reflectivity. For this reason, when the wafer height in one chip is detected while scanningly moving the wafer, the light quantity upon the detector also changes on an order of msec.

Since the light quantity of a halogen lamp cannot be adjusted instantly as described above, the waveform responsive to reception of light by the light position detector 102 during scan of one chip, as having been photoelectrically converted, may change such as shown in FIG. 3(A), corresponding to illumination of a low-reflectivity portion of an IC chip, and as shown in FIG. 3(B), corresponding to illumination of a high-reflectivity portion of an IC chip. Thus, the light quantity may be over and under. This may end in failure of determining the waveform peak correctly and, therefore, in failure of accurate detection of the wafer height. It may then cause degradation of resolution upon a wafer as a circuit pattern is printed thereon, and this may cause production of defective chips, which directly leads to decreased yield.

On the other hand, in recent exposure apparatuses, enlargement of a numerical aperture (N.A.) of a projection optical system for enhanced resolving power has caused a reduction of back focus of the projection optical system, such that the autofocus (AF) detection system has to execute the focus detection while using a very small space between the projection optical system and a wafer. Further, as regards the angle of incidence of light projected to the wafer, in order to minimize slipping of detection light into the resist material, usually the light is projected with an incidence angle of more than 80 deg. Because of such a spatial restriction and for ensuring the depth of focus of the autofocus detection system itself, the numerical aperture of the autofocus detection system is generally set to about 0.035 at the maximum.

FIG. 4 illustrates reflection of light projected to the wafer 4 of FIG. 1B, in detail. In this drawing, denoted at 35 is a resist, and denoted at 36 is a process step (surface step). Denoted at 37 is a silicon substrate (wafer). Among paths of light rays, those illustrated by broken lines 31'–33' are light paths as the autofocus light is projected to a flat portion of the resist 35 surface. Those illustrated by broken lines 31"–33" are light paths as the autofocus light is projected to a slant portion of the wafer 37. A local slant of the resist 35 surface may have a largest tilt of about 1–2 deg. On that occasion, with a light receiving system having a small numerical aperture such as described above, there is a possibility that light is eclipsed by the light receiving system (in practice, by a stop thereof). Such an eclipse of light by the light receiving system will cause not only a reduction in light quantity upon the light receiving surface, but also an asymmetrical waveform which may then be a major factor of detection error. In conventional light receiving systems, it is difficult to discriminate from an obtained waveform whether the detection signal contains an error or not. Thus, a focus control signal is produced even if a measurement error is included.

SUMMARY OF THE INVENTION

It is an object of the present invention to provide a surface position detecting system by which, when surface position information related to the surface of an object is to be produced with an oblique (grazing) light projection system, goodness/non-goodness of a signal obtained through a photoreceptor can be discriminated such that the surface position information can be produced at a high precision without being affected by the surface shape of the object.

It is another object of the present invention to provide an exposure apparatus with such surface position detecting system as above.

It is a further object of the present invention to provide a device manufacturing method which uses such a surface position detecting system as above.

These and other objects, features and advantages of the present invention will become more apparent upon a consideration of the following description of the preferred embodiments of the present invention taken in conjunction with the accompanying drawings.

BRIEF DESCRIPTION OF THE DRAWINGS

FIGS. 1B through 1D are a schematic views for explaining a portion of FIG. 1A.

FIGS. 7(A) through 7(C) are schematic views for explaining operation of the surface position detecting system of the FIG. 5 embodiment.

DESCRIPTION OF THE PREFERRED EMBODIMENTS

Figure 1A:
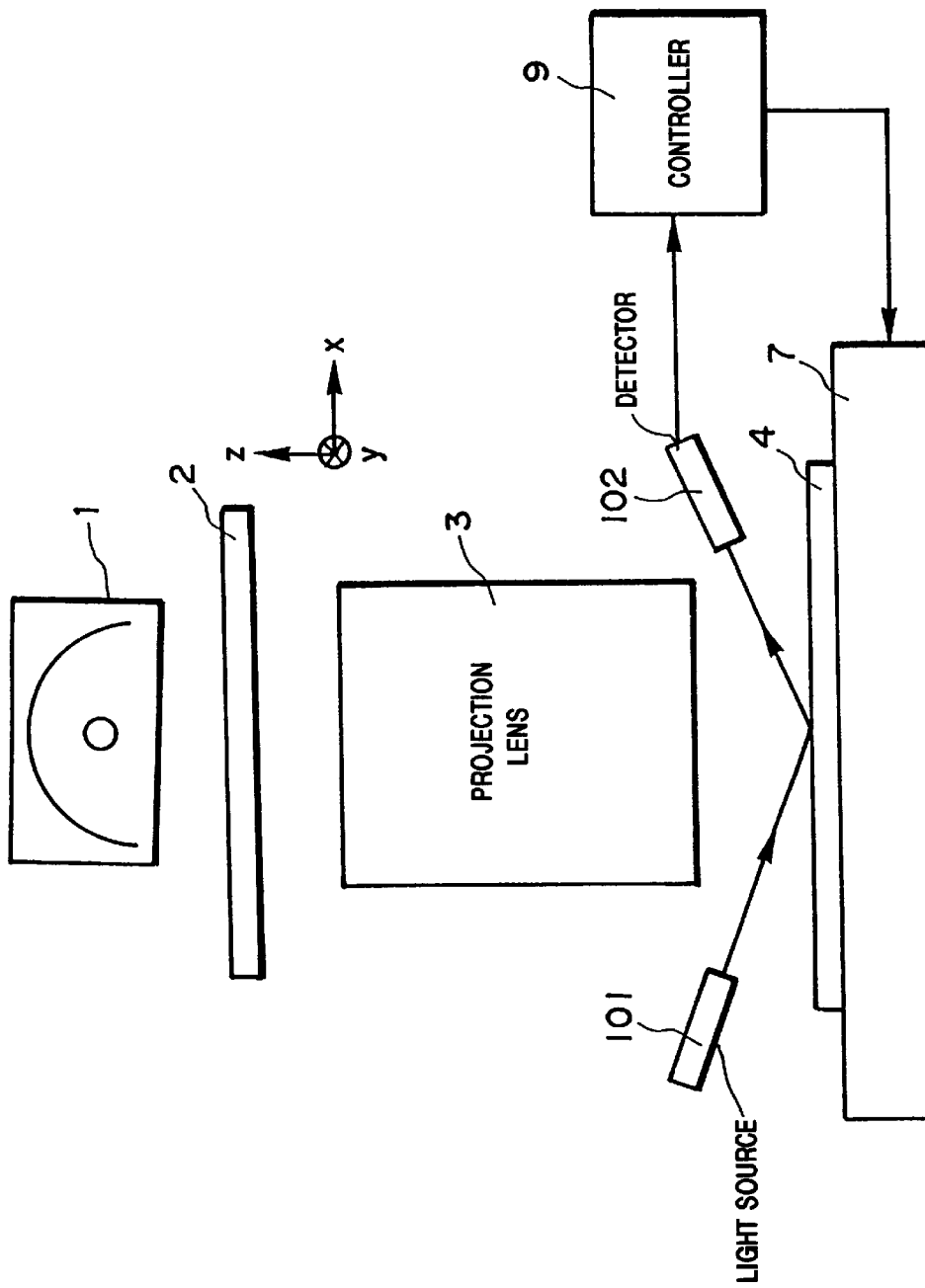
FIG. 1A is a schematic view of a main portion of a surface position detecting system of a known type.
Figure 2:
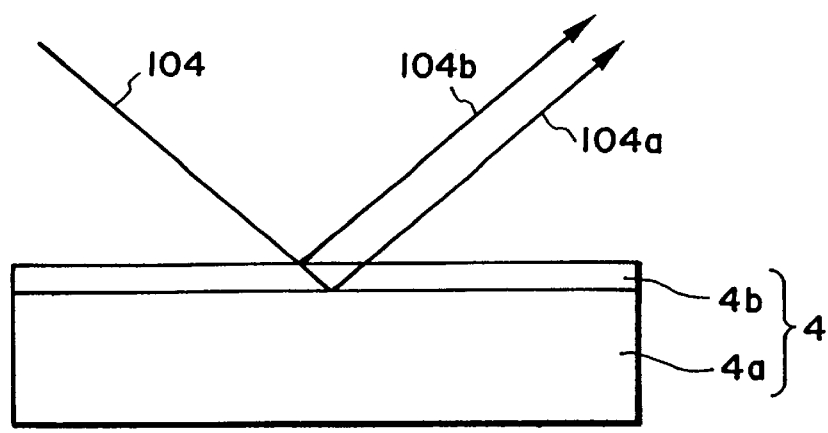
FIG. 2 is an enlarged view of a portion of FIG. 1A.
Figure 3A:
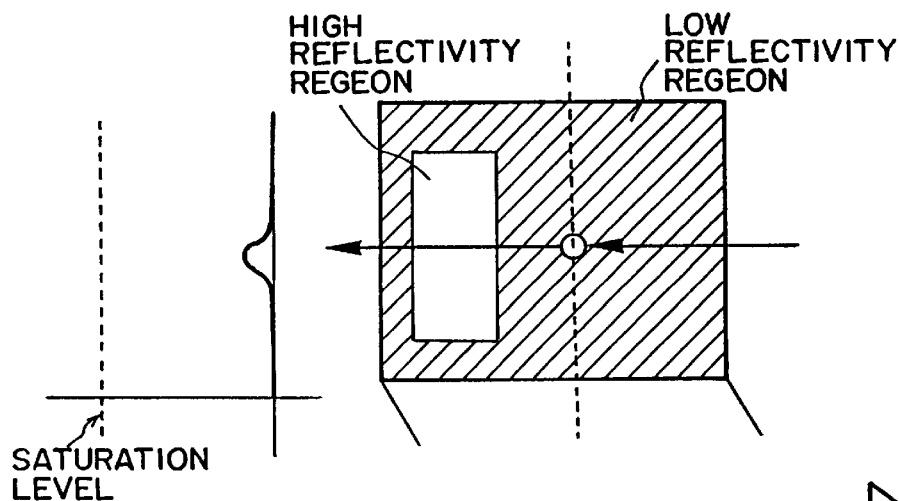
FIGS. 3(A) and 3(B) are a schematic views for explaining reflection characteristics on the surface of a wafer, in a surface position detecting system of a known type.
Figure 3B:
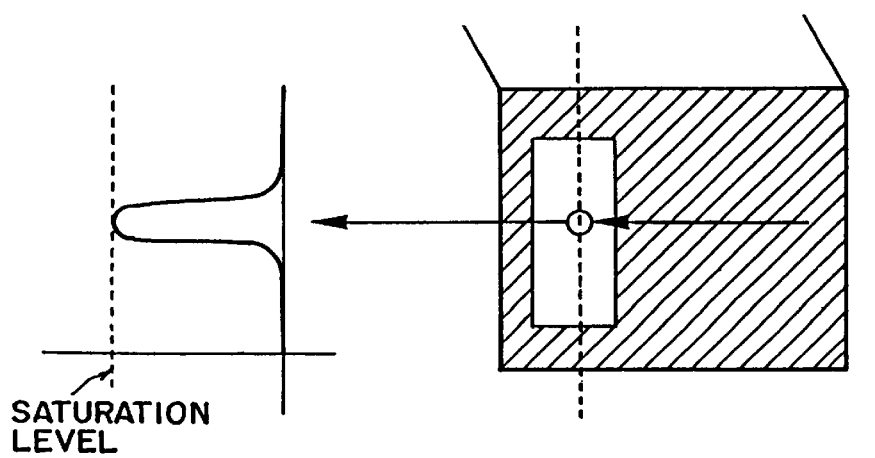
Figure 4:
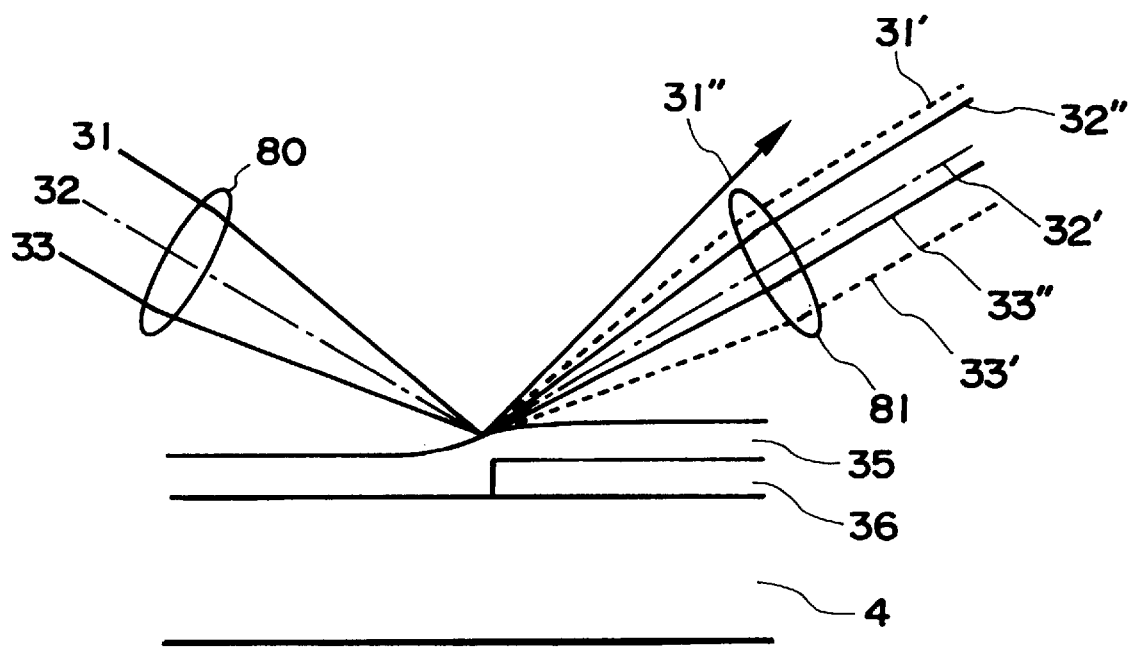
FIG. 4 is an enlarged view for explaining light paths when a slant portion of a wafer is measured.
Figure 5:
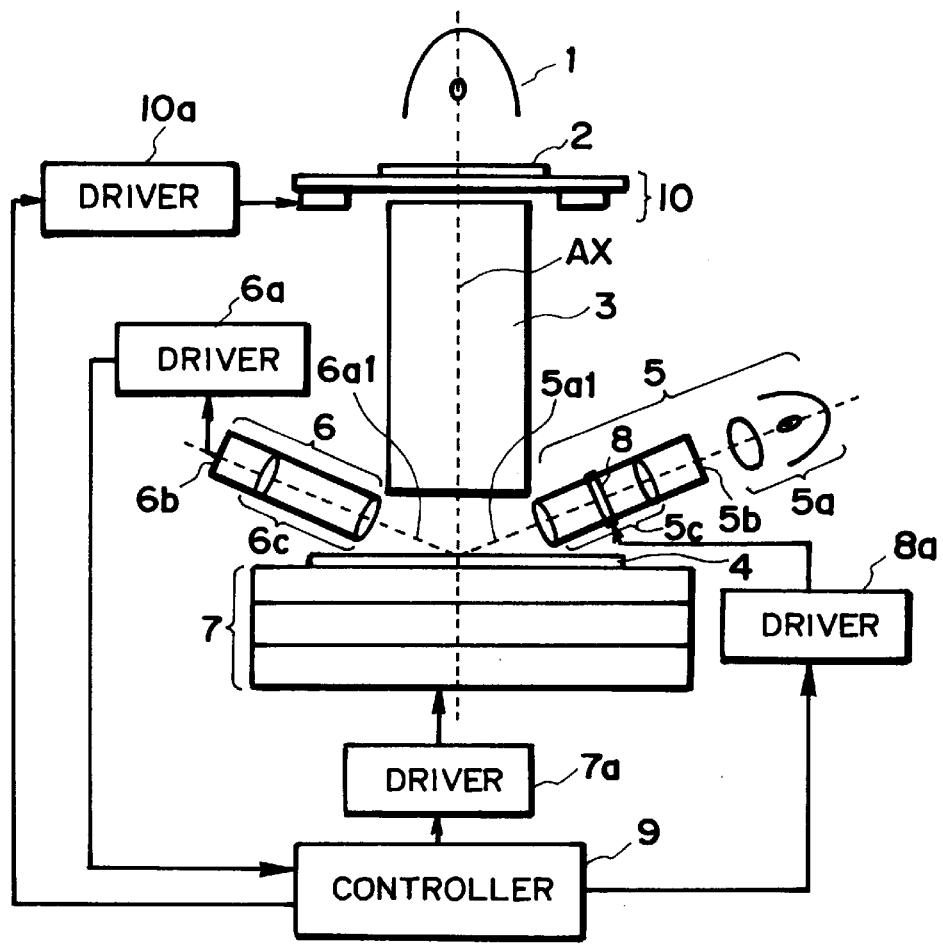
FIG. 5 is a schematic view of a main portion of a surface position detecting system according to a first embodiment of the present invention.
Figure 6:
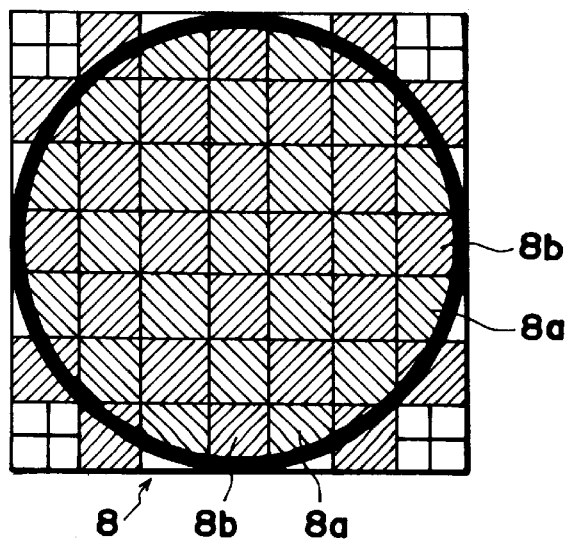
FIG. 6 is an enlarged view for explaining a portion of FIG. 1.

FIG. 5 is a schematic view of a main portion of a first embodiment of the present invention, and FIG. 6 is an enlarged view of FIG. 5. FIG. 7 is an illustration for explaining operation of the first embodiment. In this embodiment, the invention is applied to a step-and-scan type scanning exposure apparatus for device manufacture.

In these drawings, denoted at 1 is an illumination system for projecting exposure light, and it provides exposure light of deep ultraviolet rays from a KrF or ArF excimer laser, for example. Denoted at 2 is a reticle (first object) on which a circuit pattern is formed. It is placed on a reticle stage 10. Denoted at 3 is a projection lens (projection optical system) for projecting, in a reduced scale, the circuit pattern of the reticle 2 onto a wafer (second object) 4 which is coated with a resist. In this embodiment, the projection exposure process is performed such that the reticle 2 and the wafer 4 are scanned at a predetermined speed ratio, in synchronism with each other in accordance with the imaging magnification of the projection optical system 3.

Denoted at 5 is a light source means which comprises a pattern (slit) 5b, a light source 5a for illuminating the slit 5b, and an imaging optical system 5c for imaging the slit 5b onto the wafer 4 surface. The pattern (slit) 5b may comprise one or plural slits. While in the drawing there is shown only one light flux 5a1 passing through one slit 5b, there may be plural light fluxes used. Denoted at 8 is a light quantity adjusting member (light valve) for adjusting the quantity of light passing therethrough. It is disposed on the path of light from the light source means 5. Denoted at 5a1 is the light passed through one slit.

Denoted at 6 is light receiving means which includes a detecting means 6b and a re-imaging system 6c for re-imaging the slit image, formed on the wafer 4 surface, upon the surface of the detecting means 6b. Denoted at 6a1 is reflection light which is based on the slit image as formed on the wafer 4 surface. The detecting means 6b may comprise a photoelectric converting element such as a CCD (charge-coupled device) or PSD (position sensing device), for example, operable to detect information related to the position of incidence of light thereupon.

Denoted at 7 is a stage which is movable in X, Y, and Z directions and which is tilt adjustable, for changing the position or tilt of the wafer 4. Denoted at 7a is a driver (driving means) for moving the stage 7 in the X, Y or Z direction or for adjusting tilt of the stage 7. Denoted at 9 is a controller (control means) which receives an output signal of the light receiving means 6 through a driver 6a. In accordance with this output signal, the controller 9 produces a signal and applies it to the driving means 7a so as to place the wafer 4 at a predetermined position with respect to the direction of the optical axis of the projection lens. Denoted at 8a is a driver for adjusting the quantity of light passing through the light valve 8, on the basis of a signal from the control means 9. That is, the driver 8a controls the quantity of light impinging on the wafer 4 surface.

Denoted at 10a is a driver (driving means) for driving the reticle stage 10 in synchronism with the wafer stage 7, on the basis of a control signal from the control means 9. The control means 9 applies a signal to the driver 8a to adjust the quantity of light passage through the light valve 8, so that the output value of a signal (peak value) obtainable at the detecting means 6a is held at a certain value.

In this embodiment, the slit image as projected on the wafer 4 surface by the light source means 5 is detected with the light receiving means 6, and information regarding the position of incidence of the slit image upon the light receiving means 6b (e.g., peak position information) is detected.

As the surface of the wafer 4 (i.e., level of the wafer surface) displaces in the optical axis AX direction, the position of the slit image on the light receiving means 6b shifts. The amount Δ of shift of it is in a proportional relation with the amount δ of change in height (level) of the wafer 4. Thus, by measuring the shift amount Δ, the amount δ of the change of level is detected. Further, for detection of tilt of the wafer 4, measurements are made to at least three points within one chip of the wafer 4 and, on the basis of results of the measurements, tilt of the wafer is calculated.

In this embodiment, positional information of the slit image to be detected by the detecting means 6b of the light receiving means 6 is produced while adjusting the quantity of passage of light from the light valve 8, which is the light quantity adjusting means on the light source means 5 side, so that the output peak value thereof comes to an appropriate level.

Next, the structure of the light valve 8 will be explained. FIG. 6 is a schematic view of the light valve 8, which comprise a liquid crystal device in this example.

As illustrated, the light valve 8 has spatially distributed light transmitting portions 8a and light blocking portions 8b, of suitable size, provided by a liquid crystal device. Distribution of these portions is controlled by the driver 8a. By changing the proportion of the light transmitting portions 8a and the light blocking portions 8b, the quantity of light to be projected to the wafer 4 can be adjusted promptly, at a rate higher than a msec order.

FIGS. 7(A) through 7(C) are schematic views for explaining signals, in relation to associated patterns of the light valve, as produced by the light receiving means 6b when, during synchronous scan exposure of the reticle 2 and the wafer, the slit image (light 5a1) from the light source means 5 is reflected by a high-reflectivity portion and a low-reflectivity portion in one chip on the wafer 4 surface and is received by the light receiving means 6b.

FIG. 7(A) corresponds to a case without the light valve 8 of the present invention. As the measurement point comes to a high-reflectivity portion of bottom substrate, the output of the slit image is saturated. Thus, it is difficult to determine the peak position and, therefore, to detect the level (surface) of the wafer 4. FIG. 7(B) corresponds to a case wherein the controller 9 is so set that the output of the detecting means 6b becomes about 70% of the saturation level and wherein the scan procedure is effected while the quantity of light passage through the light valve 8 is controlled accordingly.

FIG. 7(C) shows changes in transmitting pattern of the light valve, 8. In order that the output of the detecting means 6b becomes close to a level expected, in the initial (left) stage of FIG. 7(C) the light quantity is enlarged. The transmitting pattern is enlarged, such that the valve is set nearly in its open state. Subsequently, at the middle stage of FIG. 7(C), since the light quantity increases, the non-transmitting pattern is enlarged. After it, at the right stage of FIG. 7(C), the transmitting pattern is enlarged again so as to enlarge the light quantity again.

In this embodiment, a liquid crystal device is used for the light valve 8 as described above, and adjustment of light promptly responsive to a change in reflectivity of the bottom substrate of the wafer 4 is enabled. This assures real-time measurement and control of the level of the wafer 4, and it facilitates production of high density devices with a scanning exposure apparatus.

Figure 8:
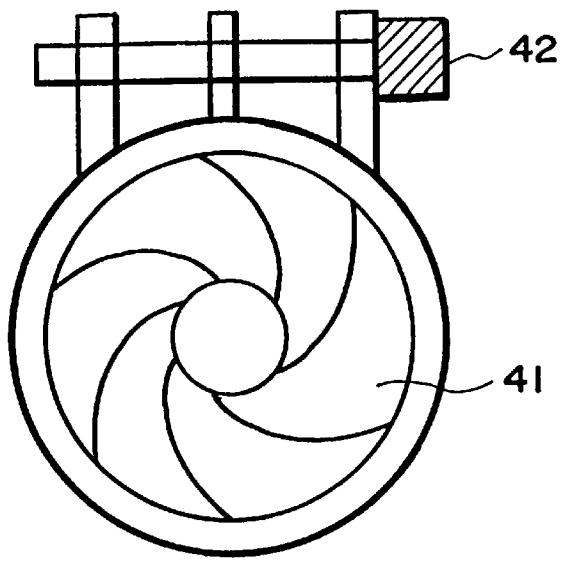
FIG. 8 is a schematic view for explaining a modified form of the FIG. 5 embodiment.

FIG. 8 is a schematic view for explaining another form of a light quantity adjusting member (light valve) usable in this embodiment. The light valve of this example may be called a variable stop. In this example, stop blades 41 are opened and closed by use of driving means 42. For high-speed opening and closing motion of the stop blades 41, an ultrasonic motor or an electromagnetic motor may be used in the driving means 42.

Figure 9:
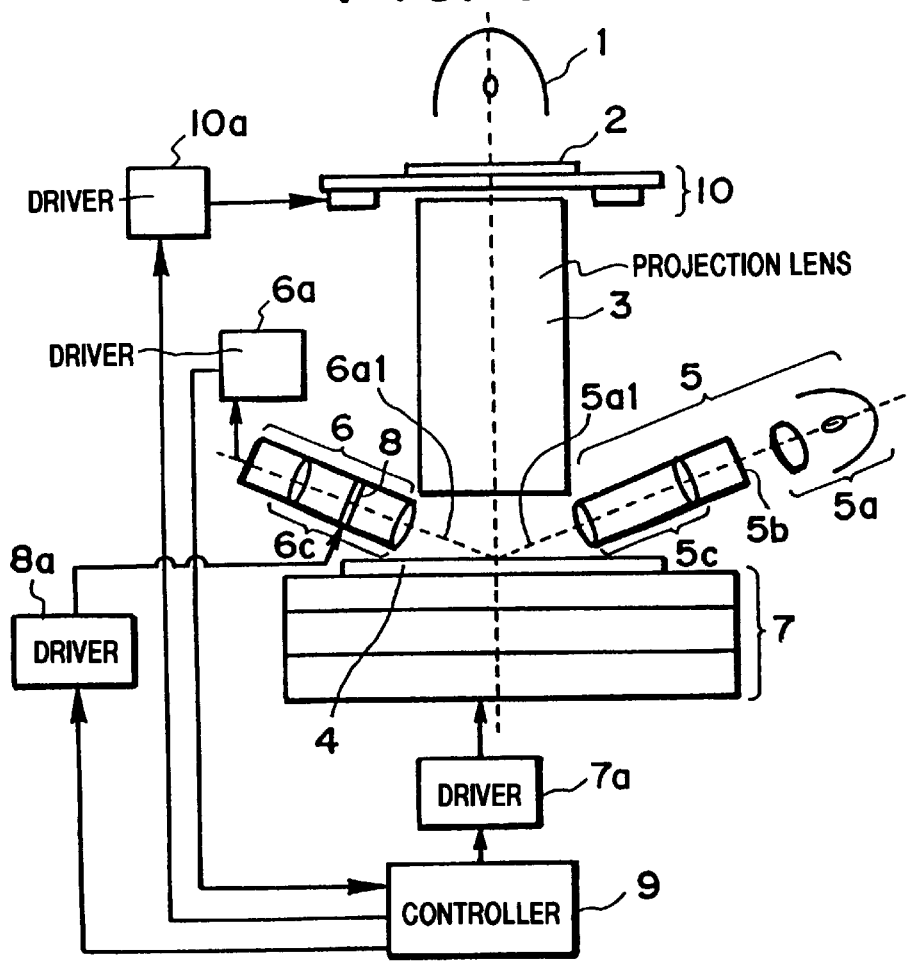
FIG. 9 is a schematic view of a main portion of a surface position detecting system according to a second embodiment of the present invention.

FIG. 9 is a schematic view of a main portion of a second embodiment of the present invention. This embodiment differs from the first embodiment of FIG. 5 in that the position of the light valve 8 is placed within the light receiving means 6. The remaining portion of this embodiment is essentially of the same structure as that of the first embodiment. In a case wherein, for a design reason, a space cannot be physically defined within the light source means 5, the light valve 8 may be disposed inside the light receiving means 6 as in this embodiment. Of course, an additional light valve may be provided on the light source means 5 side, if it is possible.

Figure 10:
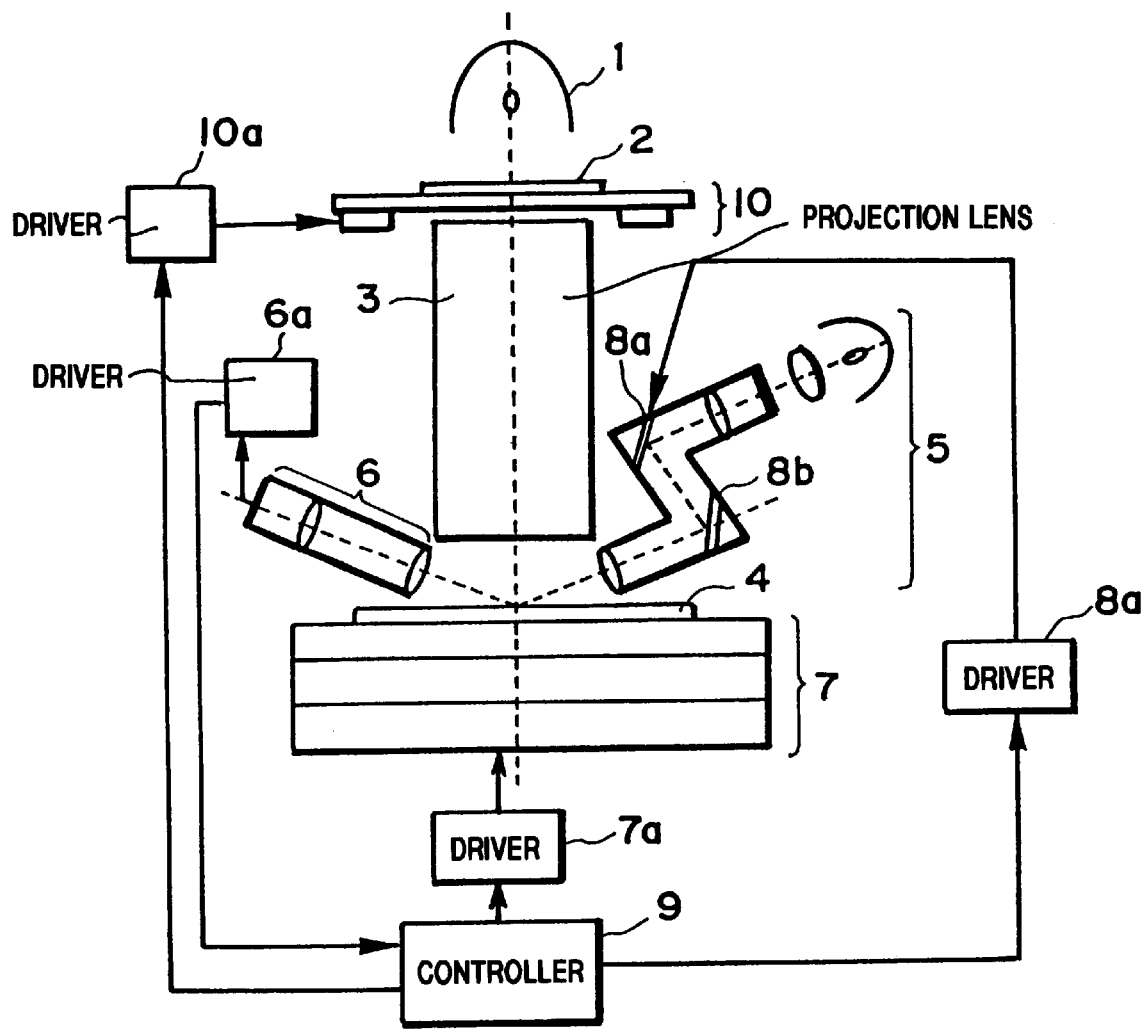
FIG. 10 is a schematic view of a main portion of a surface position detecting system according to a third embodiment of the present invention.
Figure 11:
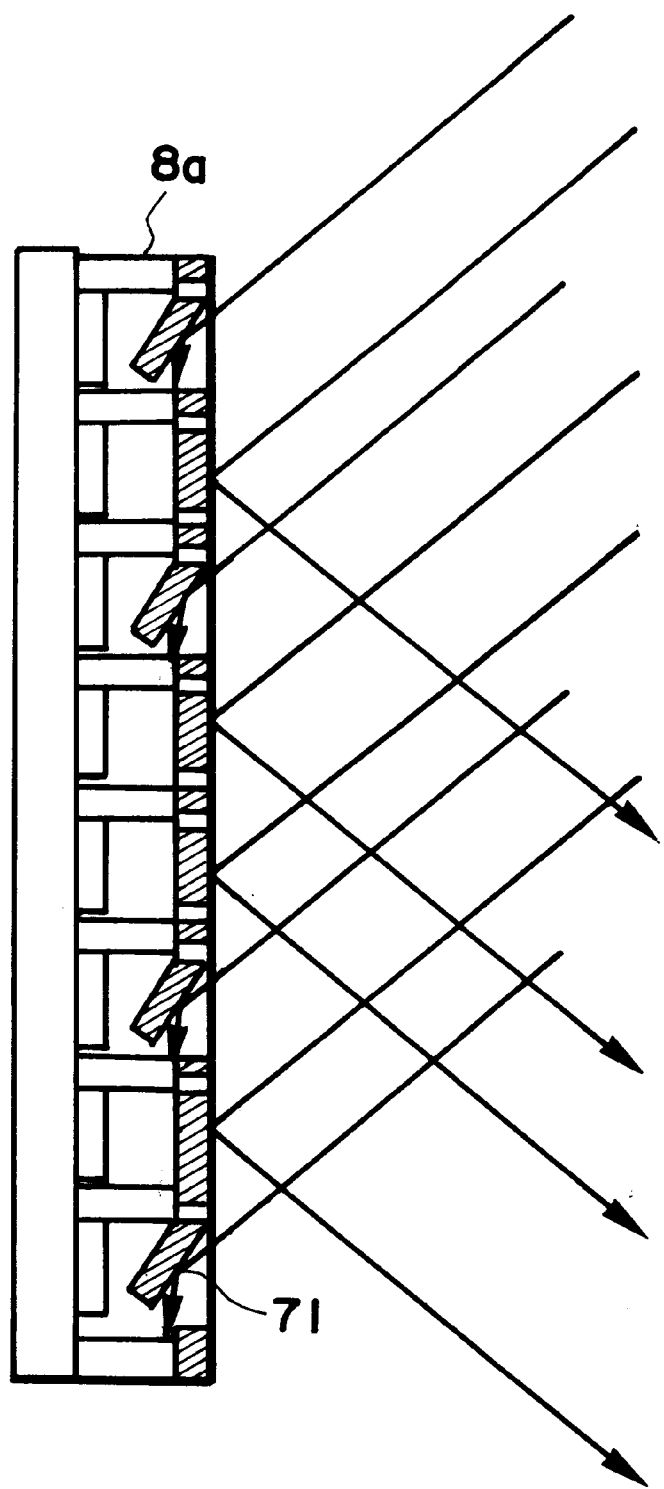
FIG. 11 is an enlarged view for explaining a portion of FIG. 10.

FIG. 10 is a schematic view of a main portion of a third embodiment of the present invention. FIG. 11 is an enlarged section of a portion of a light valve used in the this embodiment. This embodiment differs from the first embodiment of FIG. 5 in that the light valve 8 comprises a reflection type element 8a and a deflection mirror 8b. The remaining portion of this embodiment is essentially of the same structure as that of the first embodiment.

The reflection type element 8a (FIG. 11) of the light valve 8 comprises small rectangular mirrors 71, each having a size of a few tens of microns square. A few hundred thousands of such mirrors may be disposed in a matrix, to provide the light valve. For this mirror structure, a silicon crystal plate may be fine processed in accordance with a lithographic process, for example, to provide a cantilever structure. Each individual small mirror may be tilted as desired by using en electrostatic force, to change the angle of reflection light to thereby provide on/off control to the light. The light quantity can be adjusted in this manner. Since, in this embodiment, the light valve is of a reflection type, degradation of the light valve due to heat can be avoided. Thus, the durability is high and, therefore, stable and high-speed light quantity control is assured.

Figure 12:
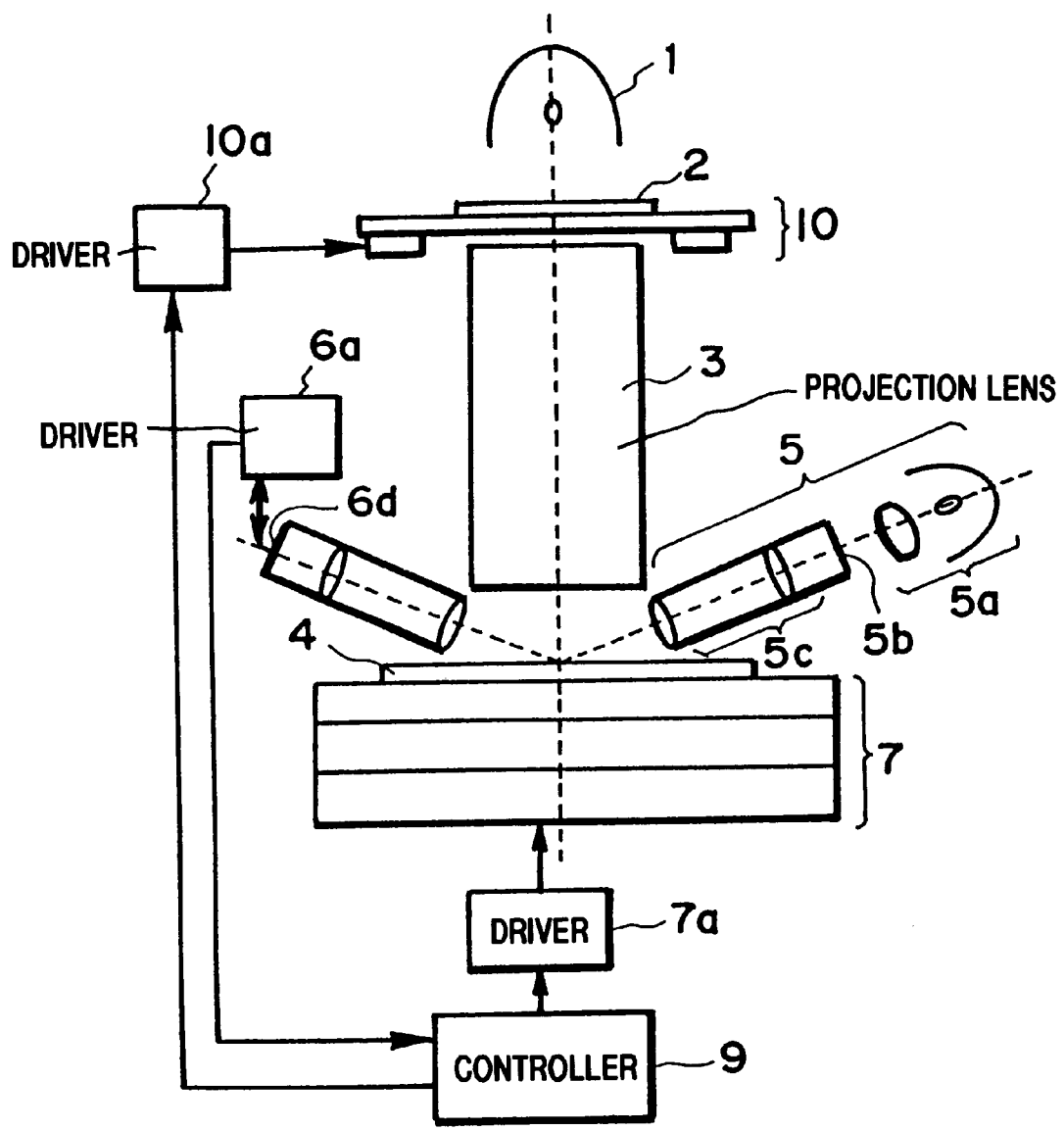
FIG. 12 is a schematic view of a main portion of a surface position detecting system according to a fourth embodiment of the present invention.

FIG. 12 is a schematic view of a main portion of a fourth embodiment of the present invention. This embodiment differs from the first embodiment of FIG. 5 in that a CCD whose charge accumulation time is controllable is used for a detecting means 6d of light position detecting means, and in that the accumulation time is controlled by means of a controller 9. In this embodiment, an optical image on the CCD 6d is first photoelectrically converted, and a peak of its output waveform is detected. Then, the peak value is compared with a saturation level of the CCD 6d. The controller 9 then calculates the accumulation time of the CCD 6d, for attaining a predetermined level and, on the basis of the result of calculation, the accumulation time of the CCD 6d is controlled. In this embodiment, as compared with the first or second embodiment, no optical element is used and a purely electrical light-quantity control system is provided. Thus, an inexpensive system is assured.

Next, an embodiment of a device manufacturing method, which uses an exposure apparatus according to any one of the preceding embodiments; will be explained.

Figure 13:
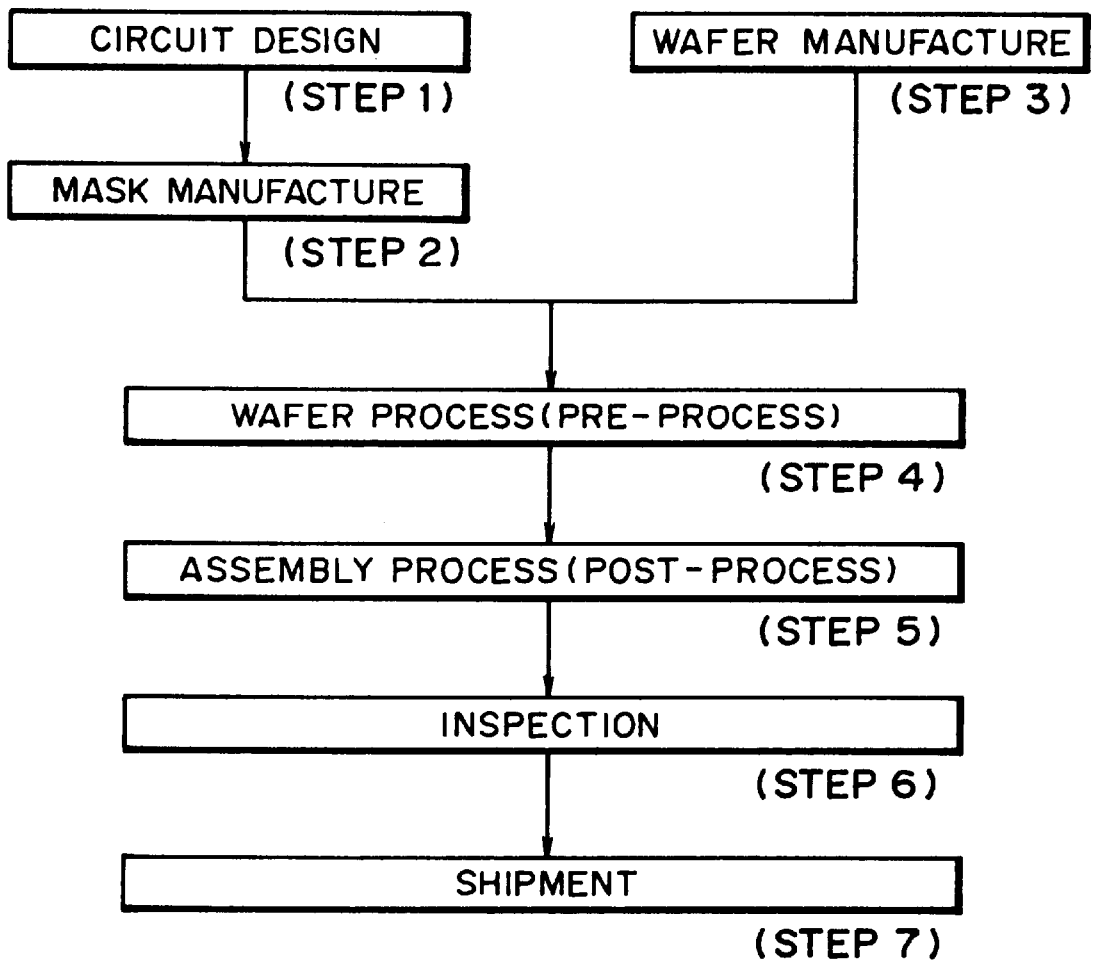
FIG. 13 is a flow chart of device manufacturing processes, according to an embodiment of the present invention.

FIG. 13 is a flow chart of the procedure for the manufacture of microdevices such as semiconductor chips (e.g., ICs or LSIs), liquid crystal panels, or CCDs, for example.

Step 1 is a design process for designing a circuit of a semiconductor device. Step 2 is a process for making a mask on the basis of the circuit pattern design. Step 3 is a process for preparing a wafer by using a material such as silicon. Step 4 is a wafer process which is called a pre-process wherein, by using the so prepared mask and wafer, circuits are practically formed on the wafer through lithography.

Step 5 subsequent to this is an assembling step which is called a post-process wherein the wafer having been processed by step 4 is formed into semiconductor chips. This step includes an assembling (dicing and bonding) process and a packaging (chip sealing) process. Step 6 is an inspection step wherein operation check, durability check and so on for the semiconductor devices provided by step 5, are carried out. With these processes, semiconductor devices are completed and they are shipped (step 7).

Figure 14:
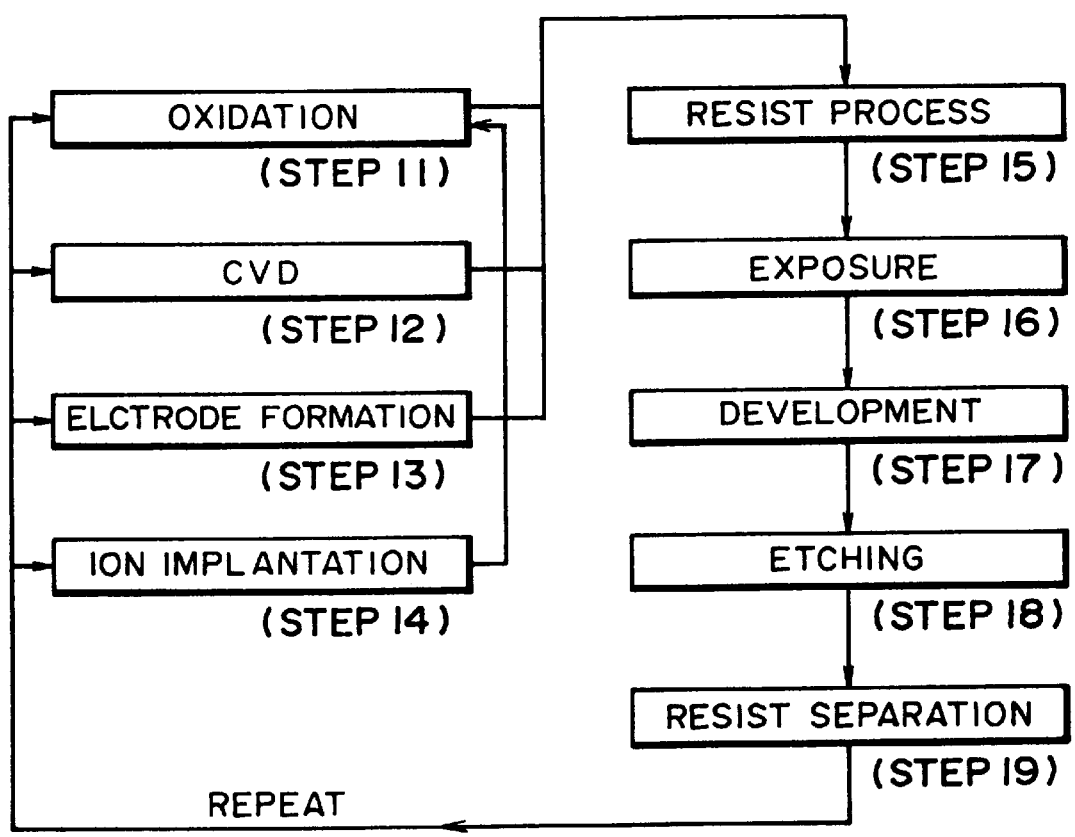
FIG. 14 is a flow chart of a wafer process included in the procedure of FIG. 13.

FIG. 14 is a flow chart showing details of the wafer process. Step 11 is an oxidation process for oxidizing the surface of a wafer. Step 12 is a CVD process for forming an insulating film on the wafer surface. Step 13 is an electrode forming process for forming electrodes upon the wafer by vapor deposition. Step 14 is an ion implanting process for implanting ions to the wafer. Step 15 is a resist process for applying a resist (photosensitive material) to the wafer. Step 16 is an exposure process for printing, by exposure, the circuit pattern of the mask on the wafer through the exposure apparatus described above.

Step 17 is a developing process for developing the exposed wafer. Step 18 is an etching process for removing portions other than the developed resist image. Step 19 is a resist separation process for separating the resist material remaining on the wafer after being subjected to the etching process. By repeating these processes, circuit patterns are superposedly formed on the wafer.

With these processes, high density microdevices can be manufactured.

In accordance with the embodiments of the present invention as described hereinbefore, for detection of positional information related to the surface of an object in accordance with an oblique light projection method, at least one of light source means and light receiving means may be provided with a light quantity adjusting member for controlling the quantity of light passing therethrough. Alternatively, the light source means may be provided with a charge accumulation type photoelectric device, and the accumulation time of that device may be controlled. The level (intensity) of an output signal from the light receiving means may be set appropriately thereby. Thus, the surface position of the object can be detected very precisely and, therefore, it can be set at a predetermined position exactly. A surface position detecting system or a device manufacturing method which facilitates manufacture of large-integration devices is therefore assured.

Figure 15:
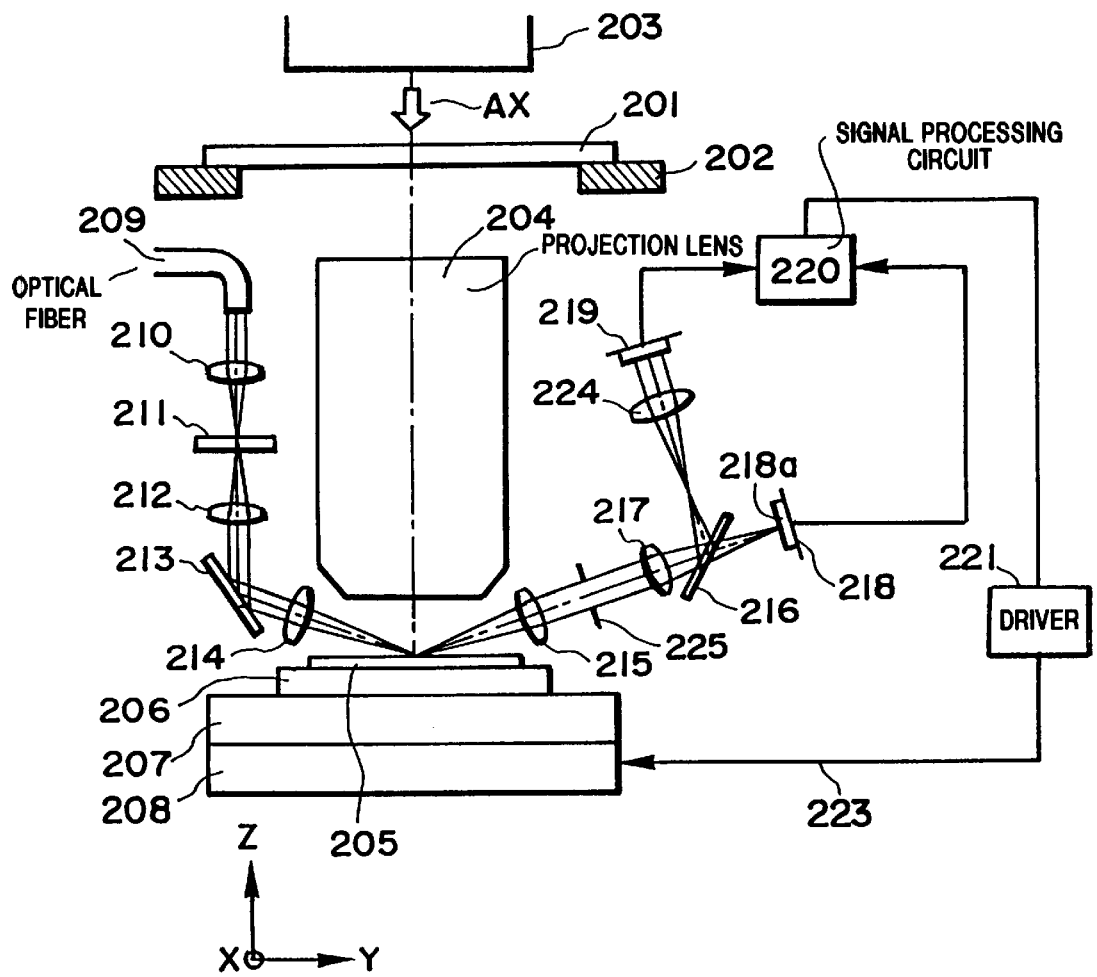
FIG. 15 a schematic view of a main portion of a surface position detecting system according to a fifth embodiment of the present invention.

FIG. 15 is a schematic view of a main portion of a fifth embodiment of the present invention. Denoted in the drawing at 201 is an original to be projected, i.e., a reticle (first object). It is placed on a reticle stage 202. It is held thereon while being aligned with respect to the main assembly of the exposure apparatus by means of an alignment mechanism, not shown. Denoted at 203 is an exposure illumination system which serves to illuminate the reticle 201. Denoted at 204 is a projection optical system for projecting and imaging a pattern of the reticle 201 onto a wafer 205. The wafer 205 is held by attraction on a wafer chuck 206. The wafer chuck 206 is mounted on an X-Y stage 207 which is movable along an X-Y plane perpendicular to the optical axis of the projection optical system 204.

The X-Y stage 207 is mounted on a Z-tilt stage 208 which is movable in the optical axis direction (Z direction) of the projection optical system 204, and also it is arranged to be tilted. The elements 207 and 208 are components of a driving system for focusing of the wafer 205 and the reticle 201. The drive of the stage 206 in the X direction is controlled by means of a laser interferometer (not shown) and a mirror (not shown) mounted in a portion of the stage 206. A similar structure is provided in with regard to the Y direction, although not shown in the drawing. This enables precise drive control along the X-Y plane.

The printing apparatus (projection exposure apparatus) of such a basic structure as described is equipped with a surface position detecting system which comprises components denoted at 209–225.

The components 209–225 of the surface position detecting system of this embodiment will be explained below.

Optical fiber 209 emits illumination light (autofocusing light) of a wavelength of about 500–1200 nm with respect to which a resist applied to the wafer 205 has no sensitivity. The light goes through a condensing lens 210 and illuminates a pattern plate 211 on which a predetermined pattern is formed. The illumination light passing through the pattern plate 211 is directed via a lens 212, a mirror 213, and a projection objective lens 214, and it is projected onto an exposure surface of the wafer 205. Here, the elements 211–214 are components of a projection system. On the exposure surface of the wafer 205, an image of the pattern of the pattern plate 211 is projected and imaged, obliquely with respect to the optical axis AX.

The illumination light reflected by the wafer 205 surface is collected by a condensing objective lens 215 and, after passing through a stop 225, it is collected by a lens system 217. The light is then bisected by a half mirror 216. Light reflected by the half mirror 216 is directed by a pupil imaging lens 224 to a two-dimensional sensor (area CCD) 219 which is disposed on a plane optically conjugate with the stop 225. A light intensity distribution of the pupil plane (stop 225) is formed on the surface of this two-dimensional sensor 219. An output signal from the sensor 219 is applied to a signal processing circuit 220.

On the other hand, light passed through the half mirror 216 serves to re-image, upon a light receiving surface 218a of a photoreceptor 218, the pattern image as formed on the wafer 205 surface, that is, the pattern formed on the pattern plate 211. The image of the pattern of the pattern plate 211 obtainable on the photoreceptor 218 provides an autofocus signal which contains positional information of the wafer 205 with respect to the optical axis AX direction. The elements denoted at 215, 216, 217 and 218 are components of a re-imaging system (light receiving system), and elements denoted at 225, 216, 224 and 219 are components of a pupil observation means.

When, in the drawing, the wafer 205 moves upwardly or downwardly along the optical axis AX direction, the pattern image on the light receiving surface 218a displaces laterally along the surface 218a. In this embodiment, the positional information of that pattern image, i.e., an autofocusing signal, is used and, on the basis of a signal from the two-dimensional sensor 219, goodness/non-goodness of the autofocusing signal is discriminated within the signal processing circuit 220. By using a predetermined autofocusing signal, the focus position of the wafer 205 (positional information with respect to the optical axis AX direction) is detected.

Figure 16A:
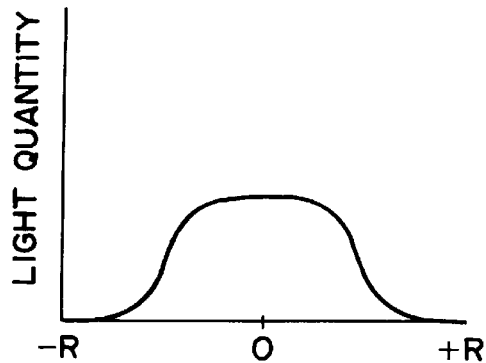
FIGS. 16A and 16B are graphs, respectively, for explaining light intensity distribution upon a pupil plane of pupil observation means of the FIG. 15 embodiment.
Figure 16B:
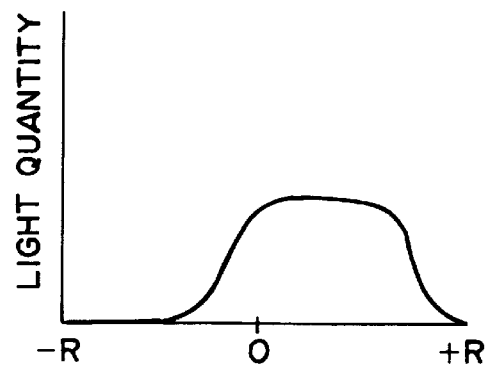

FIGS. 16A and 16B are graphs, each showing a light intensity distribution on the two-dimensional sensor 219 with the focus detection direction (optical axis AX direction) being taken on the axis of the abscissa.

When measurement is made to a flat portion of the wafer 205, the detection light to be detected by the two-dimensional sensor 219 may have an intensity distribution which is symmetrical with respect to the optical axis of the light receiving system (215). Thus, in the pupil observation system, there is an intensity distribution such as shown in FIG. 16A, which is symmetrical with respect to the center of the stop 217 (i.e., of the image of it). Here, denoted at R is the radius of the stop 217.

On the other hand, when a measurement is made to a slant portion of the wafer 205, reflection light from the wafer 205 is such that, upon the pupil plane (217) of the light receiving system, there occurs a deviation between the center of light and the optical axis, as described hereinbefore. Thus, the light intensity distribution on the pupil plane (225) is asymmetric with respect to the center of the stop, as illustrated in FIG. 16B. The two-dimensional sensor 219 produces and applies a signal to an operation circuit 220. On the basis of this signal, the operation circuit 220 discriminates goodness/non-goodness of the autofocus signal as produced by the photoreceptor 218.

An example is that the gravity center position of the light quantity distribution of FIGS. 16A or 16B is calculated. For this calculation, the point on the two-dimensional sensor 219 surface corresponding to the optical axis center of the light receiving system is detected beforehand. A discrimination may be done by projecting an image of the stop 225 onto the sensor 219. If the light gravity center coordinates as determined by calculation are within a predetermined range from the optical axis center of the two-dimensional sensor 219, it is concluded that the autofocus signal is a reliable signal (good signal). If the light gravity center coordinates are out of the predetermined range, it means a possibility that a portion of the light is being eclipsed. Thus, it is concluded that the autofocus signal is a non-good signal.

In this embodiment, the signal goodness/non-goodness discrimination procedure described above may be incorporated in a multi-point measurement focus detection system of the type disclosed in Japanese Laid-Open Patent Application, Laid-Open No. 283403/1994, for example, with which an autofocus signal is obtainable with respect to plural positions on the wafer surface. On that occasion, only information related to those measurement points of high reliability is selected and processed, whereby a focus signal of high reliability is produced and enhanced autofocus precision is ensured.

Then, on the basis of a signal from the operation circuit 220 and in response to a drive signal 223, driving means 221 moves the Z-tilt stage 228 in the optical axis AX direction, to place the wafer 205 on the best image plane of the projection optical system 204.

While, in this embodiment, the autofocusing light path is divided by the half mirror 216 and an image of the stop 225 is imaged on the two-dimensional sensor 219 by means of the pupil imaging lens 224, the light path may be divided at any other location provided that the CCD 219 may be placed at a pupil position.

Now, an example of projection exposure with a step-and-repeat type scanning exposure apparatus will be explained. In this example, a projection exposure apparatus such as shown in FIG. 15 is used, and light from the exposure illumination system 228 is shaped into light of a slit-like shape by illumination means. This light illuminates a pattern on the reticle 201 surface. The pattern of the reticle 201 is projected onto the surface of the wafer 205 placed on a movable stage, through the projection optical system 204, while the reticle and the movable stage are scanningly and synchronously moved (for scan exposure) in the widthwise direction of the slit-like light, at a speed ratio corresponding to the imaging magnification of the projection optical system 204.

For scan exposure, from the standpoint of throughput, real-time autofocusing is preferable since the focus measurement is performed within the exposure process. Since, however, it is difficult to measure a process wafer with an optical method without error, in many cases, pre-scanning is performed to determine offset.

Figure 17:
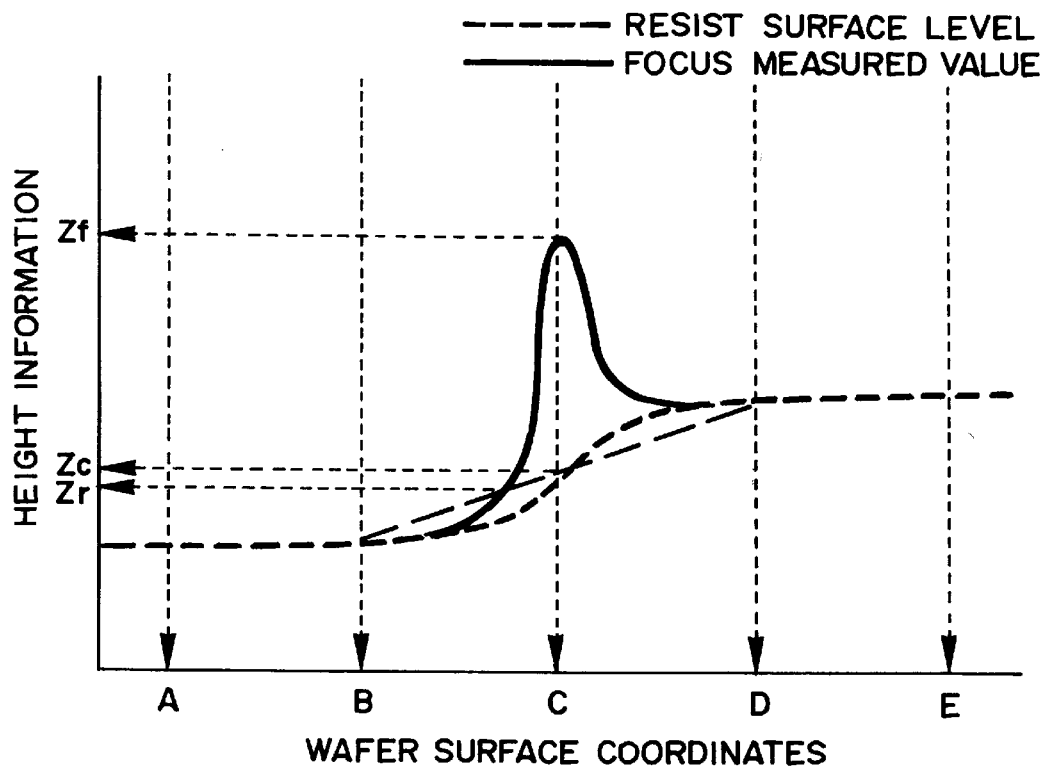
FIG. 17 is a graph for explaining signal processing in operation circuit means of the FIG. 15 embodiment.

FIG. 17 is a graph for explaining a focus signal (autofocus signal) from a region of a wafer surface, including a slant portion. A broken line depicts the surface shape of a resist, and a solid line depicts focus measured values corresponding to it. Points A, B, C, D, and E denote focused sampling positions on the wafer surface. Since the sampling positions A, B, D and E correspond to measurement to flat portions of the wafer 5, the focus signal reflects the actual surface step. At the sampling position C, however, a portion of light is eclipsed due to the slant of the resist and, thus, the signal output does not reflect the shape of the surface step. In such a case, with conventional autofocus detecting systems, signal processing is executed on an assumption that the bottom substrate has such a surface step. As a result, at the sampling position C, an error Zf-Zr is produced.

In accordance with the method of the present invention, as compared therewith, from the result of processing with the pupil observation system, the height information Zf can be discriminated as being based on an incorrect detection. Thus, the height information Zf is not taken as a focus signal.

In this embodiment, a target value signal for the sampling position C may be complemented by focus measured values at the sampling points before and after it.

In the FIG. 17 example, for the focus measured value at the sampling position C, the outputs at the sampling positions B and C are averaged to determine a target value signal Zc. In place thereof, an exclusive DSP (digital signal processor) may be included in the operation circuit 220 to perform curve fitting. Any way, in this manner, a focus control signal which exactly reflects the actual surface step shape can be produced.

Next, a case wherein real-time autofocusing is to be executed on the basis of the method of the present invention will be explained. When multi-point measurement is to be done within the exposure slit, any defective signal is excluded from autofocus signals obtained in relation to plural points having been measured. A focus control signal is produced on the basis of an average of the remaining autofocus signals. If integration of the optical system is not attainable and measurement can be done only with respect to a limited number of points within the exposure slit, a pre-focus method to be described below can be used.

Figure 18:
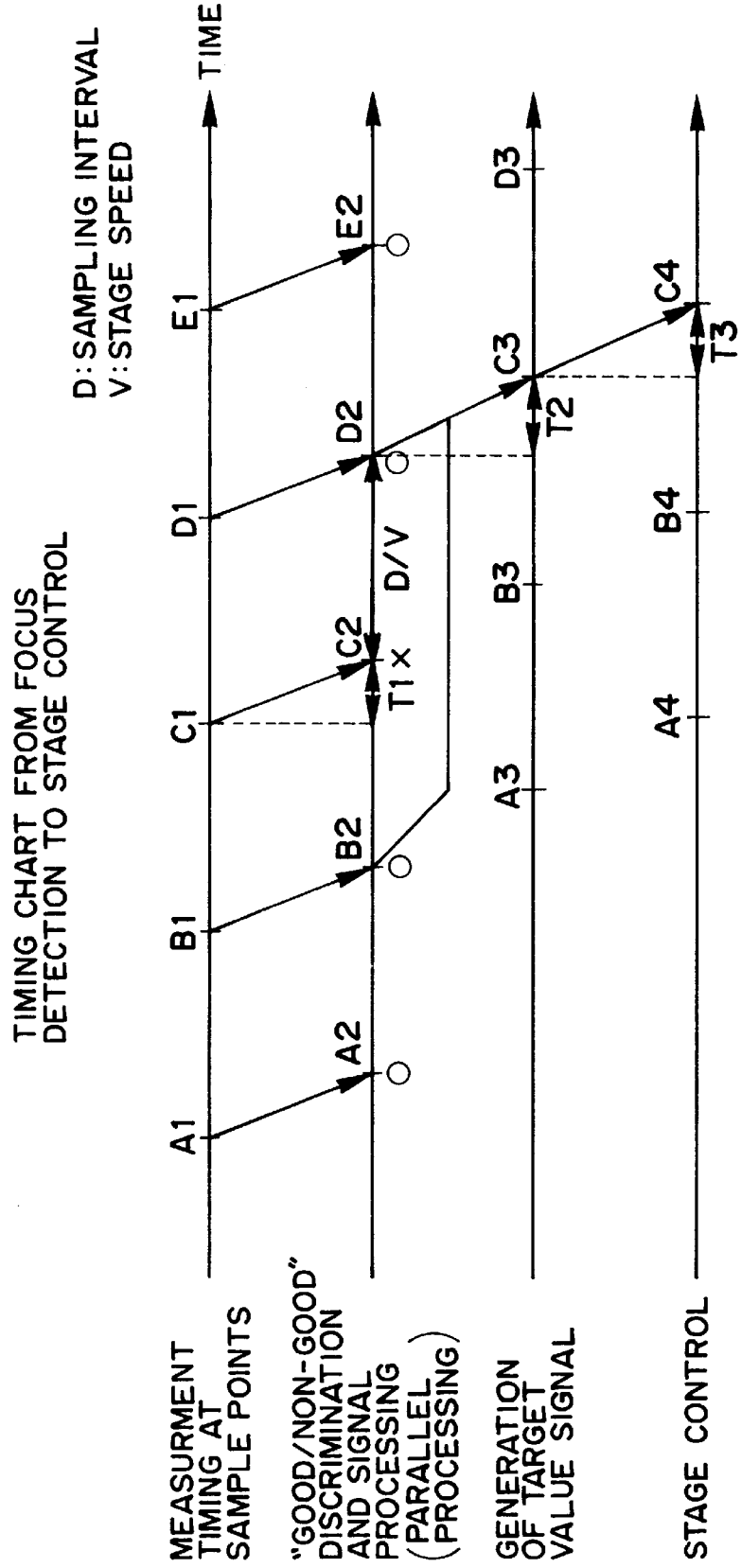
FIG. 18 is a timing chart for explaining operation timing of the FIG. 15 embodiment.

The pre-focus method will be explained with reference to FIGS. 17 and 18. FIG. 18 is a timing chart, from signal discrimination in a case wherein measurement to a surface step such as shown in FIG. 17 is made at the sampling points A–E, to the stage control.

In this embodiment, such an algorithm is used that, when a defective signal is produced, a signal for that defective measurement point is calculated on the basis of signals at the sampling positions before and after that point. Here, time periods as required in such a case from measurement (C1) at the sampling position C to focus control (C4) for the sampling position C are illustrated in the timing chart. First of all, time period T1 is necessitated for signal goodness/non-goodness discrimination as well as signal processing. The output from the pupil observation means is produced from a two-dimensional sensor separately from the autofocus signal and, therefore, it is processed in parallel.

If the sampling position C2 is discriminated as a defective signal, output of the next sampling position D2 is waited for in order to make a correction signal. The time period therefor is, if the sampling interval is TD and the stage speed is V, represented by TD/V.

Subsequently, from the signals at the sampling positions B2 and D2, a correction signal C3 is prepared. A time period T2 is required therefor. If a time period necessary for feeding a target value signal to the control system and for performing the control in practice, is represented by T3, then the overall time period from the moment of measurement C1 to the stage control C4 is equal to D/V+T1+T2+T3.

It is seen from the above that, when a defective signal is to be complemented by signals at points ±n, an autofocus measurement point is set at the position which is upstream of the exposure position by n·D+(T1+T2+T3)·V.

With the method described above, precise focus detection is attainable without decreasing the throughput with pre-scan.

It is to be noted that the embodiments of the present invention as described above are applicable also to exposure apparatuses of types other than that shown in FIG. 15, such as, for example, an apparatus wherein a pattern image is projected through a projection mirror system, or an apparatus wherein a pattern image is projected through a projection optical system comprising lenses and mirrors.

Further, the embodiments of the present invention as described above are similarly applicable also to exposure apparatuses other than optical exposure apparatuses, such as, for example, an electron beam exposure apparatus wherein a circuit pattern is drawn or projected by use of an electron beam and an electron lens, or an X-ray exposure apparatus. Still further, the present invention is similarly applicable also to an optical instrument other than an exposure apparatus, wherein detection of surface position is required.

An embodiment of a device manufacturing method which uses a surface position detecting system or a scanning exposure according to the fifth embodiment described above, may be essentially the same as that having been explained with reference to FIGS. 13 and 14. A duplicate description will therefore be omitted. In a process similar to Step 16 (exposure step) in FIG. 14, a circuit pattern of a mask is printed on a wafer with the exposure apparatus having been described above. In accordance with the device manufacturing method of this embodiment, production of large integration semiconductor devices can be facilitated.

In the fifth embodiment of the present invention as described hereinbefore, for detection of positional information related to the surface of an object in accordance with an oblique light projection method, pupil observation means is provided in a portion of re-imaging means which serves to project a predetermined pattern obliquely onto the surface of the object and to re-image the pattern obliquely upon a predetermined plane. A discrimination of goodness/non-goodness of a signal obtainable at a photoreceptor may be done on the basis of a signal from the pupil observation means. In this manner, a surface position detecting system capable of detecting surface position information easily, without being affected by the surface shape of the object, is ensured and, also, a device manufacturing method using such a surface position detecting system is accomplished.

Particularly, when such a surface position detecting system is incorporated into an exposure apparatus for the manufacture of semiconductor devices, incorrect error of focus position is reduced and, therefore, exposure of a wafer at the best focus is assured. Thus, yield can be enhanced and throughput can be enlarged.

While the invention has been described with reference to the structures disclosed herein, it is not confined to the details set forth and this application is intended to cover such modifications or changes as may come within the purposes of the improvements or the scope of the following claims.

What is claimed is:

1. A surface position detecting system for detecting a position of a surface of an object disposed opposed to an exposure system, with respect to a direction of an optical system of said exposure system, said surface position detecting system comprising:

irradiation means for projecting light to the surface of the object, obliquely with respect to the optical axis of said exposure system;

detecting means for projecting, with a light receiving optical system, light from the surface of the object irradiated with the light from said irradiation means, onto a surface of a photoreceptor and for detecting the same;

operation means for detecting a position of the surface of the object with respect to the optical axis direction of the exposure system, on the basis of a signal from said photoreceptor; and pupil plane detecting means for detecting light intensity distribution on a pupil plane of said light receiving optical system, wherein said operation means selects a signal from signals obtainable at said photoreceptor, on the basis of the detection by said pupil plane detecting means.

2. An exposure apparatus, comprising:

a projection optical system for projecting a pattern formed on a surface of a first object, onto a surface of a second object disposed adjacent to an imaging plane of said projection optical system;

irradiation means for projecting light to the surface of the object, obliquely with respect to the optical axis of said projection optical system;

detecting means for projecting, with a light receiving optical system, light from the surface of the object irradiated with the light from said irradiation means, onto a surface of a photoreceptor and for detecting the same;

operation means for detecting a position of the surface of the object with respect to the optical axis direction of said projection optical system, on the basis of a signal from said photoreceptor; and pupil plane detecting means for detecting a light intensity distribution on a pupil plane of said light receiving optical system, wherein said operation means selects a signal from signals obtainable at said photoreceptor, on the basis of the detection by said pupil plane detecting means.

3. A device manufacturing method, comprising the steps of:

projecting a circuit pattern of a reticle onto a surface of a wafer disposed adjacent to an imaging plane of a projection optical system;

projecting, with irradiation means, light to the surface of the wafer obliquely with respect to a direction of an optical axis of the projection optical system;

projecting, with a light receiving optical system, light from the surface of the wafer irradiated with the light from the irradiation means, onto a surface of a photoreceptor and for detecting the same;

detecting a position of the surface of the wafer with respect to a direction of an optical axis of the projection optical system, on the basis of a signal from the photoreceptor;

controlling the position of the surface of the wafer with respect to the optical axis direction of the projection optical system, on the basis of the position detected by said detection;

detecting a light intensity distribution on a pupil plane of the projection optical system;

selecting a signal from signals obtainable at the photoreceptor, on the basis of the detected light intensity distribution on the pupil plane; and processing the wafer having been exposed to the circuit pattern with the projection optical system, to produce a device.

* * * * *